(12) United States Patent
Fietz et al.

(10) Patent No.: US 11,328,841 B2
(45) Date of Patent: May 10, 2022

(54) METHOD AND DEVICE FOR PRODUCING A SUPERCONDUCTIVE CONDUCTOR

(71) Applicant: Karlsruher Institut für Technologie, Karlsruhe (DE)

(72) Inventors: Walter Fietz, Karlsruhe (DE); Michael J. Wolf, Karlsruhe (DE); Reinhard Heller, Karlsruhe (DE); Klaus-Peter Weiss, Karlsruhe (DE)

(73) Assignee: Karlsruher Institut für Technologie

( * ) Notice: Subject to any disclaimer, the term of this patent is extended or adjusted under 35 U.S.C. 154(b) by 966 days.

(21) Appl. No.: 15/752,224

(22) PCT Filed: Aug. 10, 2016

(86) PCT No.: PCT/EP2016/001369
§ 371 (c)(1),
(2) Date: Feb. 12, 2018

(87) PCT Pub. No.: WO2017/025190
PCT Pub. Date: Feb. 16, 2017

(65) Prior Publication Data
US 2018/0226177 A1    Aug. 9, 2018

(30) Foreign Application Priority Data

Aug. 12, 2015  (DE) ............... 10 2015 010 676.7

(51) Int. Cl.
*H01B 12/06*  (2006.01)
*H01L 39/14*  (2006.01)
(Continued)

(52) U.S. Cl.
CPC ............. *H01B 12/06* (2013.01); *B23K 1/19* (2013.01); *H01B 13/008* (2013.01); *H01F 6/06* (2013.01);
(Continued)

(58) Field of Classification Search
CPC ....................................................... H01B 12/06
See application file for complete search history.

(56) References Cited

U.S. PATENT DOCUMENTS

| 5,299,728 A | 4/1994 | King et al. |
| 2009/0194316 A1* | 8/2009 | Thomas ............. H01L 39/2403 174/125.1 |
| 2010/0022396 A1* | 1/2010 | Otto ........................ H02G 15/34 505/231 |

FOREIGN PATENT DOCUMENTS

| JP | 2002-270422 A | 9/2002 |
| JP | 2010 033821 | 2/2010 |

(Continued)

OTHER PUBLICATIONS

Machine translation of KR 2007-0093702 printed on Sep. 15, 2020 but which foreign patent issued Sep. 2007, pp. 1-10.*

(Continued)

*Primary Examiner* — Paul A Wartalowicz
(74) *Attorney, Agent, or Firm* — Klarquist Sparkman, LLP

(57) ABSTRACT

Methods and devices for producing a superconductive conductor are disclosed. The method includes providing a plurality of conductive strips by means of a strip provision device, applying liquid soldering agent onto the plurality of conductive strips, stacking the conductive strips wetted with soldering agent, and forming a superconductive body by machining the strip stack.

17 Claims, 14 Drawing Sheets

(51) Int. Cl.
*H01L 39/24* (2006.01)
*B23K 1/19* (2006.01)
*H01B 13/008* (2006.01)
*H01F 6/06* (2006.01)
*H01L 39/12* (2006.01)

(52) U.S. Cl.
CPC .......... *H01L 39/126* (2013.01); *H01L 39/143* (2013.01); *H01L 39/248* (2013.01)

(56) References Cited

FOREIGN PATENT DOCUMENTS

| | | | |
|---|---|---|---|
| JP | 2010-044969 A | | 2/2010 |
| KR | 2007 0093702 | | 9/2007 |
| KR | 2007-0093702 A | * | 9/2007 |
| WO | WO 2010/042259 | | 4/2010 |
| WO | WO 2014/035155 A1 | | 3/2014 |

OTHER PUBLICATIONS

Translation of KR 2007-0093702, obtained Oct. 14, 2020 for the foreign patent which issued Sep. 2007, pp. 1-47.*
Translation of KR20070093702A (Year: 2007).*
International Search Report, dated Nov. 25, 2016, for related PCT Application No. PCT/EP2016/001369, 6 pages.
Wolf et al., "HTS CroCo: A Stacked HTS Conductor Optimized for High Currents and Long-Length Production," *IEEE Transactions on Applied Superconductivity*, 26(2): 19-24, Mar. 1, 2016.

* cited by examiner

METHOD AND DEVICE FOR PRODUCING A SUPERCONDUCTIVE CONDUCTOR

CROSS REFERENCE TO RELATED APPLICATIONS

This is the U.S. National Stage of International Application No. PCT/EP2016/001369, filed Aug. 10, 2016, which in turn claims the benefit of German Patent Application No. 10 2015 010 676.7, filed Aug. 12, 2015. German Patent Application No. 10 2015 010 676.7 is incorporated herein in its entirety.

The invention refers to a method and a device for producing a superconductive conductor.

Superconductors are materials whose electrical resistance completely disappears below a specific temperature. As a consequence, superconductors do not have any electrical DC losses provided that they are operated at sufficiently low temperatures. A conductor for transporting electricity or a coil made of such superconductive materials consequently does not exhibit any DC losses. Thus electricity can be transferred very efficiently via such a conductor. In particular, high magnetic fields can be produced very efficiently with superconductive magnets. Low-temperature and high-temperature superconductors are distinguished according to the value of the temperature of the phase transition from the superconductive to the normal conductive state. With low-temperature superconductors this is typically under 30 K, with high-temperature superconductors in part significantly higher, e.g. above the boiling point of nitrogen (T=−196° C.). For this reason high-temperature superconductors (HTS) are also discussed for further applications since—compared to low-temperature superconductors—the effort of cooling is significantly reduced. This includes among others energy transmission, rotating machines, such as generators, engines, etc., or magnets, such as NMR or particle accelerators.

High-temperature superconductors made of Rare Earth Barium Copper Oxide (abbreviated REBCO) are the most interesting HTS materials available on the market at present with regard to the field and temperature range as well as current density. However, they are produced as thin strips or ribbons onto which the superconductor is deposited with a thickness of approximately 1 μm, so that a strip with a typical thickness of 100 μm with a width in the millimeter range is produced. No classic stranding techniques for producing cables of high ampacity can be used for these flat strips, so that new approaches are required for producing electrical conductors or cables, respectively, for higher currents out of the superconductors.

In transferring high electrical powers by means of superconductors the conductors must be cooled appropriately. In this respect it is desirable to keep the volume to be cooled as low as possible, i.e. to achieve high current densities in the bundle or cable, respectively. A high power density is also desired in the production of high fields in large magnets. At the same time a high mechanic stability of the cables is required, for instance with regard to mechanical support with lowest possible heat input, thermic cycles or electromagnetic forces.

For this reason it is a task of the present invention to provide a method and a device for producing a compact, mechanically stable superconductive conductor designed for high current densities.

This task is solved by the subject matters of the independent claims. Advantageous embodiments are subject matter of the dependent claims.

A first independent aspect for the solution of the task concerns a method for producing a superconductive conductor, comprising the following steps, in particular in the specified sequence:

providing a plurality of conductive strips or ribbons by means of a strip provision device, wherein the plurality of conductive strips comprises at least one superconductive strip;

applying liquid soldering agent onto the plurality of conductive strips by means of a soldering device;

forming a strip stack by stacking the conductive strips wetted with soldering agent by means of a stack forming device;

forming a superconductive body by machining the strip stack by means of a roll system.

By a conductive or electrically conductive strip, respectively, in general a flat, electrically conductive strip is meant, having for instance a thickness of approximately 100 μm and for instance a width of approximately 2 mm to 12 mm. The length of a conductive strip can be for instance 1 m to 1 km or more, depending on the application. A conductive strip can in particular be a metal strip, such as a copper strip. In other words, the conductive strip can in part or completely be made of metal, such as copper. A conductive strip, however, can also be superconductive. In other words, a conductive strip can be a superconductive strip.

A superconductive strip is a strip comprising a substrate onto which a superconductor, in particular a high-temperature superconductor such as REBCO, is deposited as a thin layer, for instance with a thickness of approximately 1 μm. The substrate can for instance have a thickness of approximately 100 μm. Thus a superconductive strip also has a thickness of approximately 100 μm and can for instance have a width of approximately 2 mm to 12 mm. The length of a superconductive strip can be for instance 1 m to 1 km or more, depending on the application. Needless to say that other values are also possible. The first and second superconductive strips preferably are high-temperature superconductive strips.

Liquid soldering agent in particular means hot or molten soldering agent, respectively, i.e. soldering agent which has been or is, respectively, heated above its melting temperature. At room temperature or below, i.e. after cooling, the soldering agent in contrast is in a solid state. According to the invention, the first and second superconductive strips are each wetted with or applied, respectively, liquid or hot or molten, respectively, soldering agent.

Subsequently, the conductive conductors wetted with liquid soldering agent are stacked by means of a stack forming device or arranged to a stack or strip stack, respectively. The stacking comprises in particular an arranging, aligning and/or orienting of the first and second superconductive strips wetted with liquid soldering agent.

Finally, a superconductive body—in particular one-piece—is formed by machining the strip stack by means of a roll system. The machining comprises in particular a forming, fixing, pressing and/or rolling. The individual conductive strips are mechanically and electrically connected or joined together, respectively, by means of the machining or rolling, respectively, of the strip stack. In particular, the conductive strips are soldered to each other by means of the cooling and solidifying of the soldering agent during the rolling process. Respective successive conductive strips are firmly connected by means of the cooling and solidifying of the soldering agent. The soldered strips or the soldered superconductive strip stack, respectively, form the superconductive body.

Preferably a soft solder such as PbSn, In, In—Sn, In—Bi, Sn—Ag, etc. is used as soldering agent.

In a preferred embodiment the providing of a plurality of conductive strips comprises providing a plurality of first conductive strips, each having a first width, and a plurality of second conductive strips, each having a second width, wherein the first width differs from the second width. The stacking of the conductive strips wetted with soldering agent preferably takes place in such a way that a strip stack with a cruciform cross-section is formed by the first and second conductive strips.

In particular, the method comprises the following steps:
providing a plurality of first conductive strips, each having a first width, and a plurality of second conductive strips, each having a second width, by means of a superconductive strip provision device, wherein the first width differs from the second width;
applying liquid soldering agent onto the first and second conductive strips by means of a soldering device;
stacking the first and second conductive strips wetted with soldering agent in such a way that a strip stack with cruciform cross-section is formed by the first and second conductive strips;
forming a superconductive body by machining the strip stack by means of a roll system.

Preferably, a plurality of first superconductive strips and a plurality of second superconductive strips is provided, wherein in each case a first superconductive strip differs from a second superconductive strip in the width of the superconductive strip. Preferably, exclusively first superconductive strips with a first width and second superconductive strips with a second width are provided, i.e. preferably no superconductive strips with other widths than the first width and the second width are provided. In particular, the first width is larger than the second width.

In another preferred embodiment, before the applying of liquid soldering agent the method preferably comprises a cleaning of the conductive strips, in particular of the first and second conductive strips, and/or an applying of a flux melting agent onto the conductive strips, in particular onto the first and second conductive strips, by means of a soldering preparation device.

The soldering preparation device preferably comprises one or more cleaning agents and/or sponges soaked with flux melting agent. In this, the sponges are arranged in such a way that the conductive strips are stripped off at the sponges. In this way, advantageously contaminations and/or oxidation are removed from the conductive strips and these are prepared for the subsequent application of soldering agent. By applying the flux melting agent, in particular the adhesion of the soldering agent on the conductive strips is promoted.

In another preferred embodiment the machining of the strip stack takes place at a point of time at which the soldering agent applied onto the conductive strips is in a liquid state. Preferably the machining takes place directly after applying the soldering agent, i.e. during the cooling and solidifying of the soldering agent. In this period of time the individual conductive strips are still flexible or displaceable, respectively, relative to each other so that in this way the strip stack can be formed easier and better. In particular, the strip stack can be twisted in a simple and form-fit way. Alternatively, the machining can also take place after a repeated heating of the strip stack, in particular above the melting temperature of the soldering agent.

In another preferred embodiment the machining of the strip stack comprises a twisting of the strip stack. The twisting preferably takes place by means of rolls or roll units, respectively, of the roll system rotated relative to each other, wherein the length of a complete (360°) twist, i.e. the so-called twist pitch, is set by means of the distance of the individual roll units and/or the relative twist angle of the individual roll units. In other words, the twist pitch of the conductor and/or strip stack and/or superconductive body or the twist pitch of the cable, respectively, can be set by means of the distance or distances, respectively, of the individual roll units and/or by means of the relative twist angle of the individual roll units.

A twisting of the strip stack or superconductive body, respectively, is particularly desirable if currents with an alternating current component are to flow through the superconductive conductor. Further, a twisting is advantageous if the conductor must be bent as for instance in case of winding a magnet. In this case, without the twisting an externally located strip of the conductor would be strongly expanded and an internal strip of the conductor strongly compressed. If, however, the conductor is twisted, expansion and compression cyclically alternate.

Compared to traditional methods, in which a twisting only is carried out after the production of the conductor, a twisting of the conductor preferably already takes place during the production of the conductor or by means of a renewed heating above the melting temperature of the soldering agent, i.e. at a point of time at which the soldering agent used for soldering the individual conductive strips is liquid still or again, respectively. By doing so, in comparison with traditional methods advantageously local stress and thus a degradation of the conductor can be reduced or avoided. In particular, the ampacity of the conductor can thus be improved.

In another preferred embodiment the method according to the application comprises an arranging or inserting of the superconductive body into a cladding tube, e.g. a copper tube, wherein the arranging or inserting of the superconductive body into the cladding tube preferably comprises an integrating, i.e. arranging/inserting, of one or more conductive fittings, into particular wires, e.g. made of copper.

Advantageously in the method according to the invention standard pieces, e.g. copper tubes in readily available standard sizes, can be used as cladding tubes. This results in a significant cost reduction compared to other approaches. The cladding tube preferably has a round cross-section.

In another preferred embodiment of the method according to the invention the superconductive body is wrapped with solder, e.g. a soldering wire or soldering strip, respectively, and/or a metal wire, in particular made of copper, aluminum and/or brass and/or a steel strip and/or an insulation material or insulation strip, respectively, for instance made of Kapton, before inserting the superconductive body into the cladding tube.

In another preferred embodiment of the method according to the invention, before inserting the superconductive body into the cladding tube the superconductive body is wrapped with solder, e.g. a soldering wire or soldering strip, respectively, and subsequently the superconductive body and/or the cladding tube is heated to at least the melting temperature of the solder in order to mechanically and/or electrically connect or join or fix, respectively, the superconductive body with the cladding tube. By heating the solder above its melting temperature it is possible to solder together the cladding tube and the superconductive body. By doing so, a mechanically stable connection with high electrical conductivity can be established between the superconductive body and the cladding tube.

In another preferred embodiment the method according to the invention moreover comprises a compacting of the cladding tube filled with the superconductive body.

The compacting comprises deformation techniques such as a rotary swaging or swaging. By means of compacting, the cross-section of the cladding tube is reduced to the extent to which it tightly fits the superconductive body, wherein the wires and/or strips introduced, if applicable, reduce the forces on the superconductive body or the conductive strips, respectively, thus protecting it/them from damage.

Another independent aspect for the solution of the task refers to a device for producing a superconductive conductor, comprising:

- a strip provision device for providing a plurality of conductive strips;
- a soldering device for applying liquid soldering agent onto the plurality of conductive strips;
- a stack forming device for forming a strip stack by stacking the conductive strips wetted with soldering agent;
- a roll system for machining the strip stack and forming a superconductive body.

In a first preferred embodiment the soldering device is part of the stack forming device. In other words, the stack forming device preferably comprises the soldering device.

The soldering device preferably comprises a soldering bath, which in particular is electrically heatable and into which the conductive strips can be immersed.

In another preferred embodiment the strip provision device comprises a plurality of first coils for providing a plurality of first conductive strips, each having a first width, and a plurality of second coils for providing a plurality of second conductive strips, each having a second width, wherein the first width differs from the second width. The plurality of first conductive strips and/or the plurality of second conductive strips comprises at least one superconductive strip. In other words, the strip provision device in particular comprises at least one coil for providing at least one superconductive strip. The conductive strips or superconductive strips, respectively, can for instance be unwound of the coils by means of a winch for a further treatment. In particular, the superconductive conductor or the cable, respectively, can be pulled through the device or facility, respectively, manually or by means of a motor with a winch on a suitable rope.

In another preferred embodiment the stack forming device is designed to form a strip stack with cruciform cross-section out of the first and second conductive strips.

In particular, the device for producing a superconductive conductor comprises:

- a strip or superconductive strip provision device for providing a plurality of first superconductive strips, each having a first width, and a plurality of second superconductive strips, each having a second width, wherein the first width differs from the second width;
- a soldering device for applying liquid, i.e. hot or molten, soldering agent, respectively, onto the first and second superconductive strips. i.e. for applying solder onto the superconductive strips;
- a stack forming device for stacking the first and second conductive strips wetted with liquid soldering agent, wherein the stack forming device is designed to form a strip stack with cruciform cross-section out of the first and second superconductive strips;
- a roll system for machining the strip stack and forming a superconductive body.

In another preferred embodiment the device according to the invention moreover comprises a soldering preparation device for cleaning and/or an applying flux melting agent onto the conductive strips, in particular onto the first and second conductive strips or superconductive strips, respectively. Preferably, the soldering preparation device is part of the strip provision device. In other words, the strip provision device comprises the soldering preparation device. By means of the soldering preparation device advantageously contaminations and/or oxidation can be removed from the strips. In the soldering preparation device the strips run through sponges soaked with cleaning agent and/or flux melting agent of the soldering preparation device and subsequently enter, preferably directly and in particular at the same height, into the soldering device or the soldering bath, respectively. In doing so, the distance of the soldering preparation device to the soldering device or the soldering bath, respectively, is selected at a minimum distance, so that the way on which a renewed oxidation may take place also is minimum.

In another preferred embodiment the roll system comprises a plurality of roll units, wherein at least a part of the roll units can be displaced and/or twisted relatively to each other. In particular, shape rolls of the roll units can be twisted. For instance, the roll units or shape rolls, respectively, each can be twisted and fixed in discrete steps, e.g. In 15° steps. In other words, for each roll unit a specific twist angle can be set. The roll units are in particular twistable in multiple degree steps. Thus a twisting can directly be introduced into the strip stack or superconductive body, respectively, during the production, i.e. still in the hot state. In this way, a degradation due to local stress can be avoided to a large extent.

The roll system preferably is designed in such a way that the distances or relative distances, respectively, between the individual roll units can be set. The length of a complete twisting, i.e. the twist pitch, can be determined or set, respectively, by setting the distances between the individual rolls or roll units, respectively, and/or by setting the twist angle from roll unit to roll unit. In other words, the twist pitch of the conductor and/or strip stack and/or superconductive body or the twist pitch of the cable, respectively, can be set via the distance or distances, respectively, of the individual roll units and/or via the relative twist angle(s) of the individual roll units. In particular, the roll system is designed to set the twist pitch of the conductor and/or strip stack and/or superconductive body or the twist pitch of the cable, respectively, via the relative distance or relative distances, respectively, of the individual roll units and/or the relative twist angle(s) of the individual roll units. Each roll unit preferably comprises a shape roll, which is resiliently mounted.

The above or below remarks regarding the embodiments of the first aspect also apply for the further independent aspect mentioned above and in particular for preferred embodiments in this regard. In particular, the above or below remarks regarding the embodiments of the respective other aspects also apply for an independent aspect of the present invention and for preferred embodiments in this regard.

In the following, individual embodiments for solving the task are described exemplarily by means of the figures. In it, the individual described embodiments in part have features which are not absolutely necessary in order to implement the claimed subject matter, which, however, provide desired features in specific applications. Thus also embodiments are to be considered as disclosed by the described technical teaching which do not have all features of the embodiments described in the following. Moreover, in order to avoid unnecessary repetitions, specific features are only mentioned with regard to individual of the embodiments described in the following. It is pointed out that the individual embodiments therefore shall not only be considered separately but also in combination. The skilled person will recognize from this combination that individual embodiments can also be modified by including individual or several features of other embodiments. It is pointed out that a systematic combination of individual embodiments with individual or several features, which are described with regard to other embodiments, can be desirable and reasonable, and shall thus be taken into account as well as covered by the specification.

BRIEF DESCRIPTION OF THE DRAWING

FIG. 4b shows a schematic perspective image of the superconductive conductor of FIG. 4a;

FIG. 5b shows a schematic perspective image of the superconductive conductor of FIG. 5a;

FIG. 6b shows a schematic perspective image of the superconductive conductor of FIG. 6a;

FIG. 7b shows a schematic perspective image of the superconductive conductor of FIG. 7a;

DETAILED DESCRIPTION OF THE DRAWINGS

The position specifications selected in the present application, such as above, below, lateral, etc., in each case refer to the directly described and illustrated figure and, in case of a change of position, are to be transferred analogously to the new position.

Figure 1:
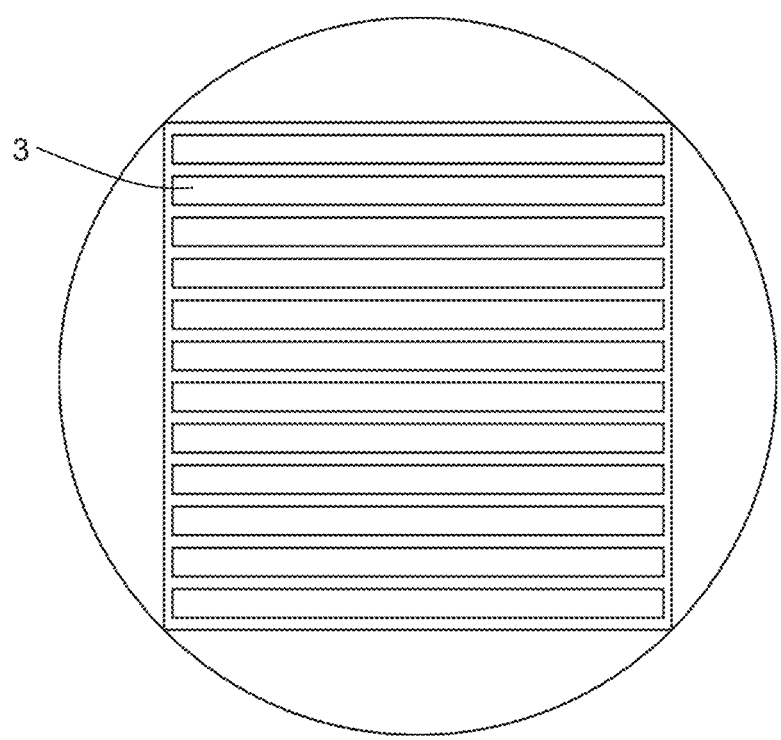
FIG. 1 shows a schematic image of the cross-section of an exemplary superconductive conductor producible with the method or device, respectively, according to the invention.

FIG. 1 shows a schematic image of the cross-section of an exemplary superconductive conductor producible with the method or device, respectively, according to the invention. The conductor comprises several conductive strips or superconductive strips 1, each of which has the same width and which are stacked one onto the other. The cross-section of the stacked superconductive strips 1 is square.

Figure 2A:
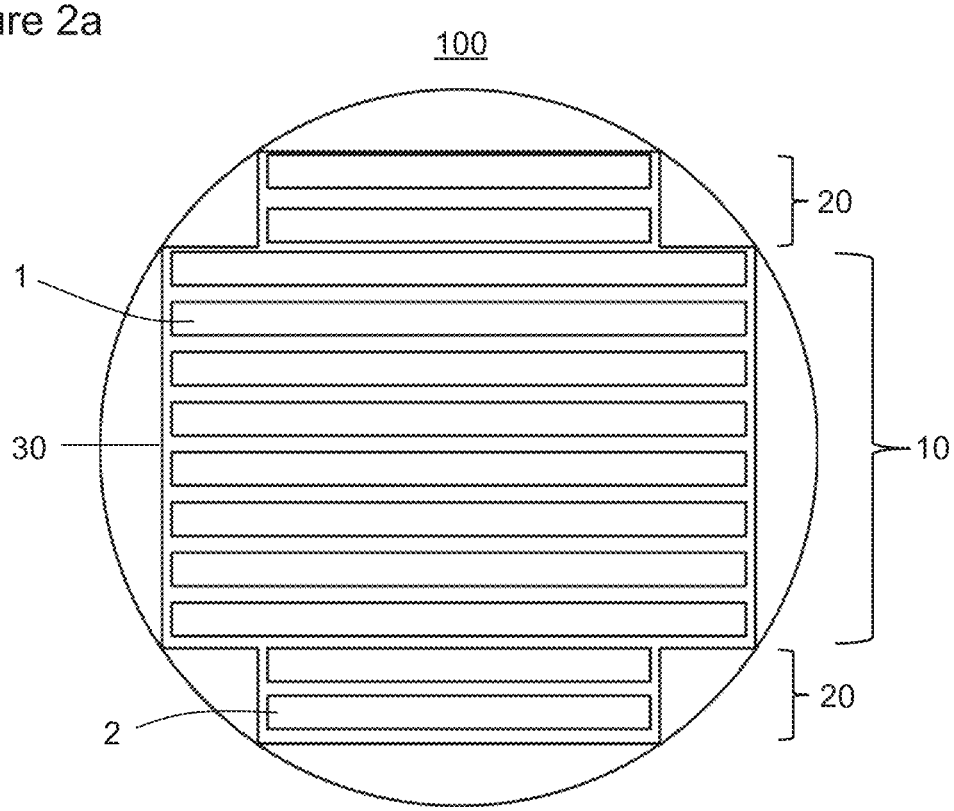
FIG. 2a shows a schematic image of the cross-section of another exemplary superconductive conductor producible with a preferred embodiment of the method or device, respectively, according to the invention.
Figure 2B:
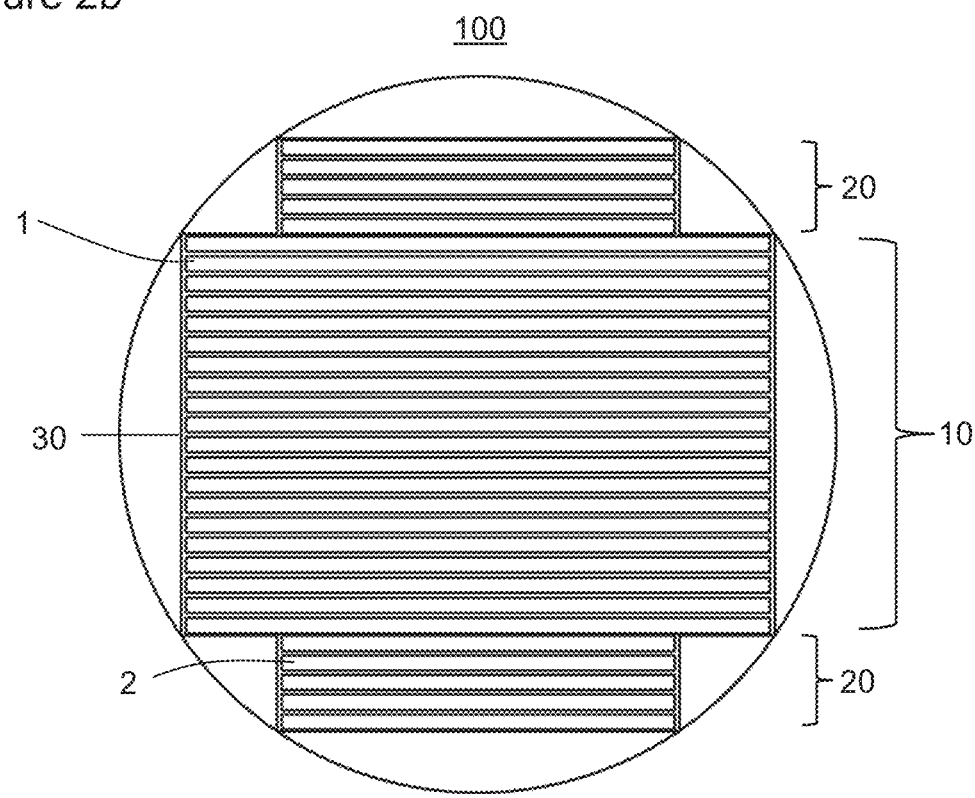
FIG. 2b shows a schematic image of the cross-section of another exemplary superconductive conductor producible with a preferred embodiment of the method or device, respectively, according to the invention.

FIGS. 2a and 2b each show a schematic image of the cross-section of another exemplary superconductive conductor 100 producible with a preferred embodiment of the method or device, respectively, according to the invention. FIGS. 2a and 2b differ merely in the number of used conductive strips or superconductive strips, respectively.

For the sake of simplicity and without loss of generality, in the following only superconductive conductors are considered in which all conductive strips 1 or 2, respectively, are superconductive strips.

In contrast to conductor 100 of FIG. 1, conductor 100 of FIGS. 2a and 2b comprises a plurality of first superconductive strips 1 and a plurality of second superconductive strips 2. The first superconductive strips 1 each have a first width and the second superconductive strips each have a second width, wherein the second width is larger than the first width. The strip stack 30 formed by superconductive strips 1 and 2 thus does not have a square but a cruciform cross-section. In other words, the cross-section of the superconductive conductor 100 has the shape of a cross. For this reason, such a superconductive conductor 100 is also called cross conductor (abbr. CroCo).

Strip stack 30 can be divided into three portions, namely into a middle portion 10 and two end portions 20. The middle portion 10, arranged between the two end portions 20, exclusively comprises first superconductive strips 1, and the two end portions 20 exclusively comprise second superconductive strips 2.

So the cross conductor has superconductive strips, in particular REBCO strips, with two different cross-sections or widths, respectively. Therefore, the circular cross-section of a round conductor can be better exploited than in up to now implemented superconductor stacks, at the same time allowing for a simple production. The use of a cruciform superconductor strip stack instead of a square superconductor strip stack results in a significant improvement of the exploitation of the cross-section. While the geometric space factor for the square stack of FIG. 1 only is 63.6%, the geometric space factor for the strip stack with cruciform cross-section is 78.4% (calculated for a first width of 6 mm and a second width of 4 mm). The ampacity or current density, respectively, of the conductor can also be increased by the significantly better exploitation of the cross-section.

Figure 3:
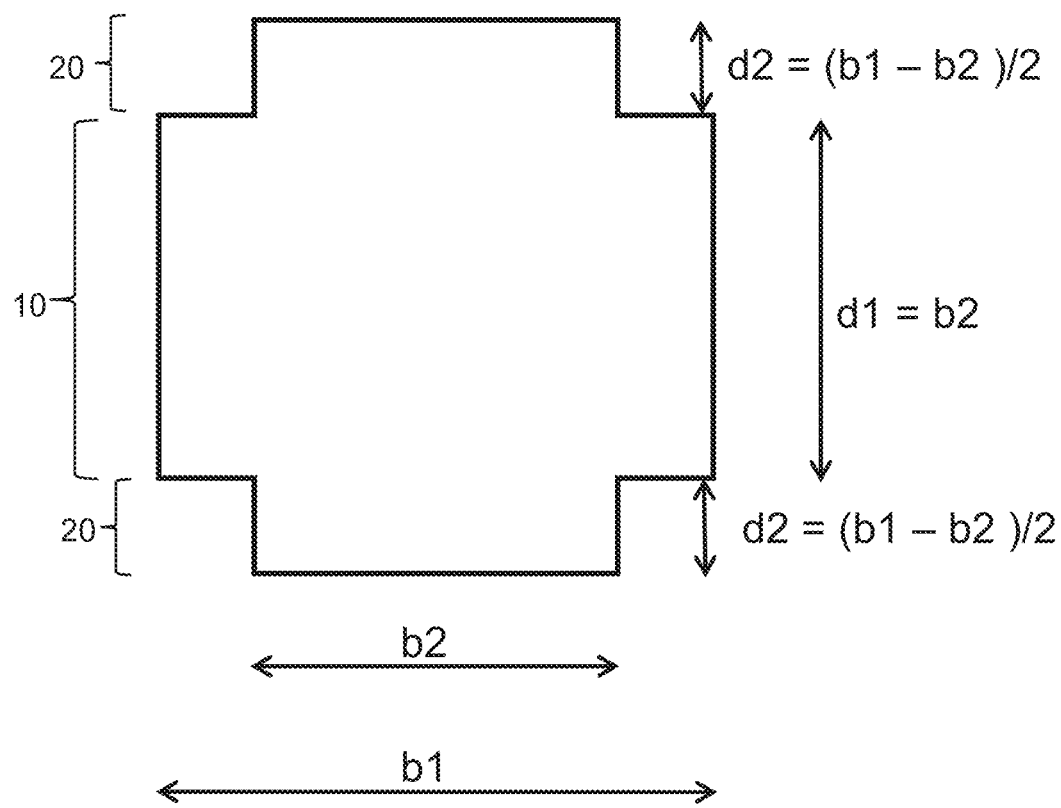
FIG. 3 shows a schematic drawing regarding the proportions of the cruciform cross-section of an exemplary superconductive conductor producible with a preferred embodiment of the method or device, respectively, according to the invention.

FIG. 3 shows a schematic drawing regarding the proportions of the cruciform cross-section of an exemplary, preferred superconductive conductor producible with a preferred embodiment of the method or device, respectively, according to the invention. In order to exploit the cross-section as well as possible the cross has a fourfold symmetry, i.e. the dimensions of the cross perpendicular to the strip surfaces correspond to the widths of the strips. The middle section 10 of the strip stack thus has a height $d_1$, which essentially corresponds to the width $b_2$ of the second superconductive strips 2. The end portions 20 each have a width $d_2$, which essentially corresponds to half the difference between width $b_1$ of the first superconductive strips 1 and width $b_2$ of the second superconductive strips 2. The end portions thus essentially have a height of $$d_2 = (b_1 - b_2)/2. \quad (2)$$

For $$b_2 = \frac{\sqrt{5}-1}{2} b_1 \approx 0.618 \cdot b_1 \quad (3)$$

the surface relation between cross surface to circumference surface is maximum. In this case a maximum area fill of 78.7% results. Of the suitable superconductive strips available on the market at present this ideal relationship can be approximated best by $b_1=6$ mm and $b_2=4$ mm, i.e. $b_2/b_1=0.667$. Thus a maximum area fill of 78.4% results, nearly corresponding to the theoretical maximum.

If width $b_1$ of the first superconductive strips is 6 mm and width $b_2$ of the second superconductive strips is 4 mm, the result for the number $N_1$ of the first superconductive strips in the middle portion 10 and for the number $N_2$ of the second superconductive strips in one of the end portions 20 is:

$$N_1 = 4 \text{ mm}/0.165 \text{ mm} \approx 24 \quad (4),$$

$$N_2 = (6 \text{ mm} - 4 \text{ mm})/0.165 \text{ mm} \approx 12 \quad (5),$$

if 0.165 mm is the thickness of the superconductive strips. In this case, the thickness of the soldering layer was not taken into account.

For instance, in total 30 to 36 strips, each of which has a thickness of ca. 150 to 165 µm, can be used for the strip stack. In this, preferably two thirds (i.e. 20 to 24) of the strips have a width of 6 mm and one third of the strips (i.e. 10 to 12) have a width of 4 mm. Taking into account the thickness of the soldering layers between the individual strips, thus a thickness of the cross conductor of about 5.5 mm to 6.2 mm results, i.e. an almost fourfold symmetry of the outer shape.

Figure 4A:
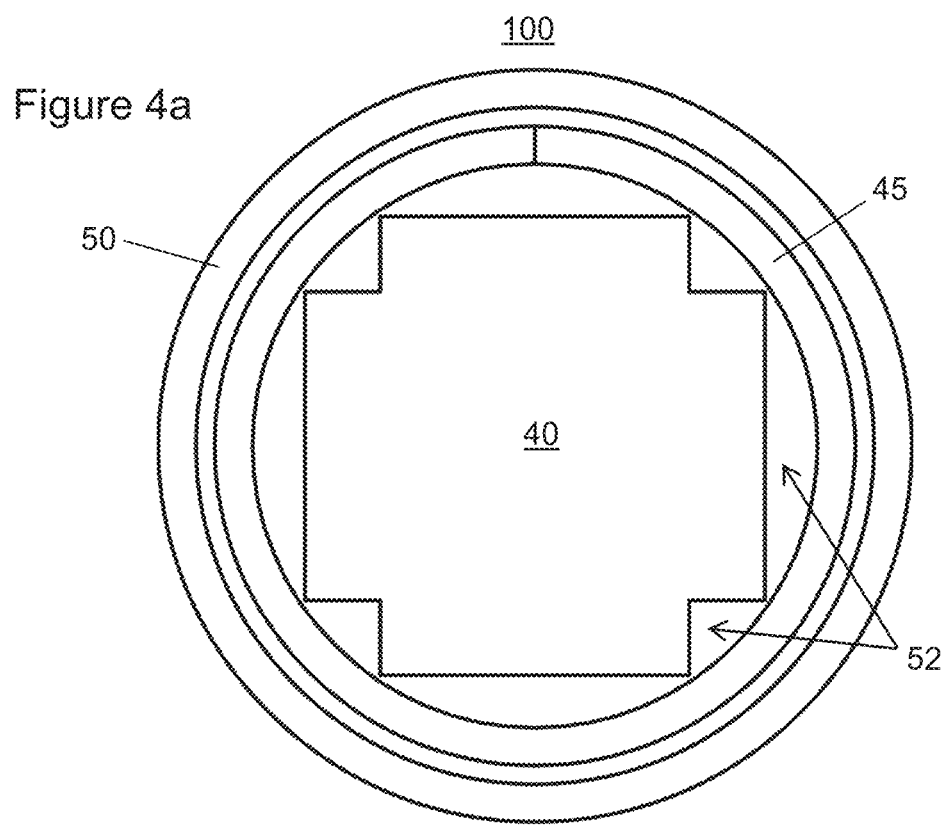
FIG. 4a shows a schematic image of the cross-section of an exemplary superconductive conductor producible with a preferred embodiment of the method or device, respectively, according to the invention, before a compacting.
Figure 4B:
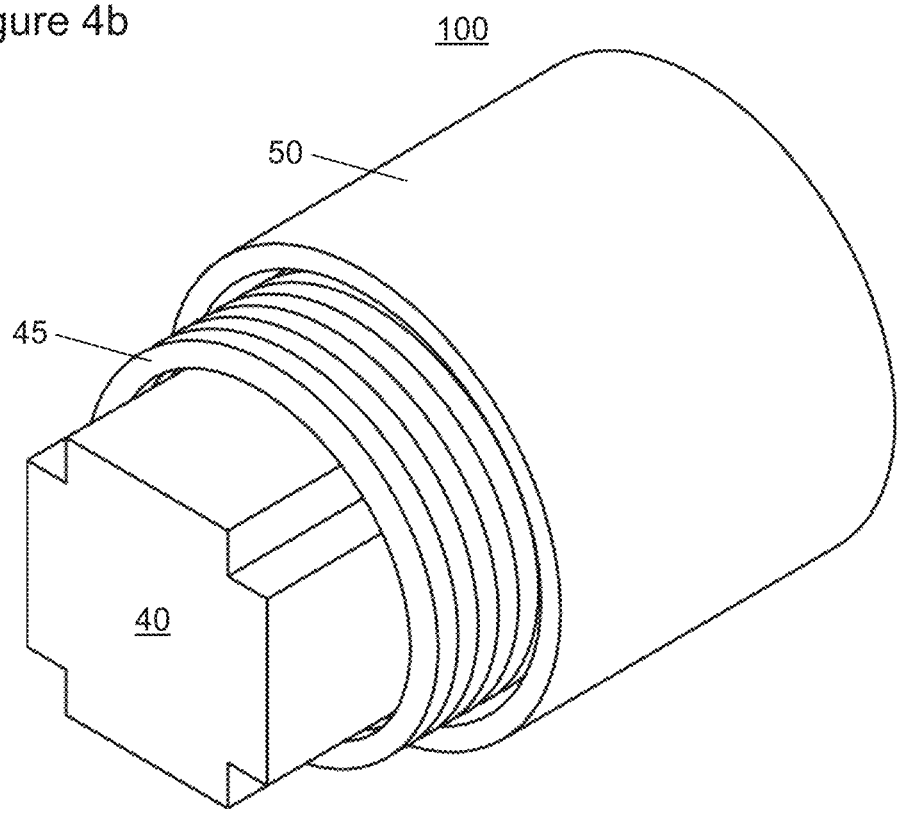

FIGS. 4a and 4b each show a schematic image of the cross-section of another exemplary superconductive conductor 100 producible with a preferred embodiment of the method or device, respectively, according to the invention, before the conductor was compacted. In it, first of all the cruciform strip stack or the individual superconductive strips of the strip stacks, respectively, were soldered into a superconductive body 40 and inserted into a round cladding tube 50, wherein the superconductive body 40 was wrapped with a soldering wire 45 before insertion into the cladding tube 50.

Figure 5A:
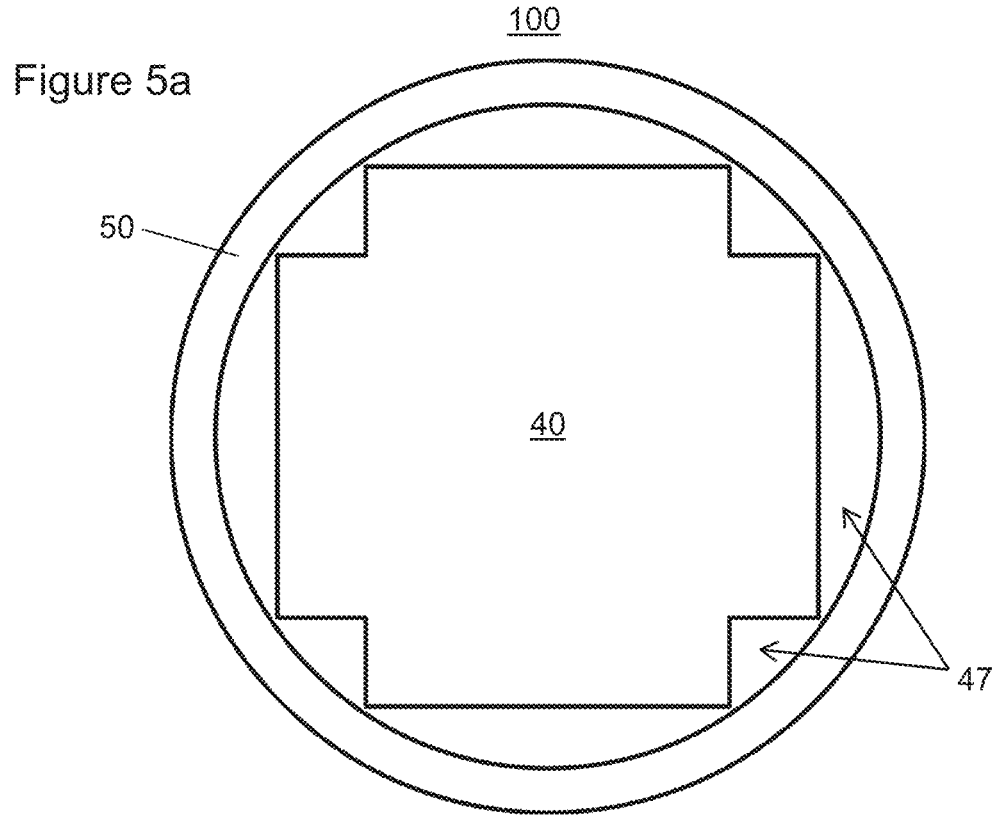
FIG. 5a shows a schematic image of the cross-section of an exemplary superconductive conductor producible with a preferred embodiment of the method or device, respectively, according to the invention, after a compacting.
Figure 5B:
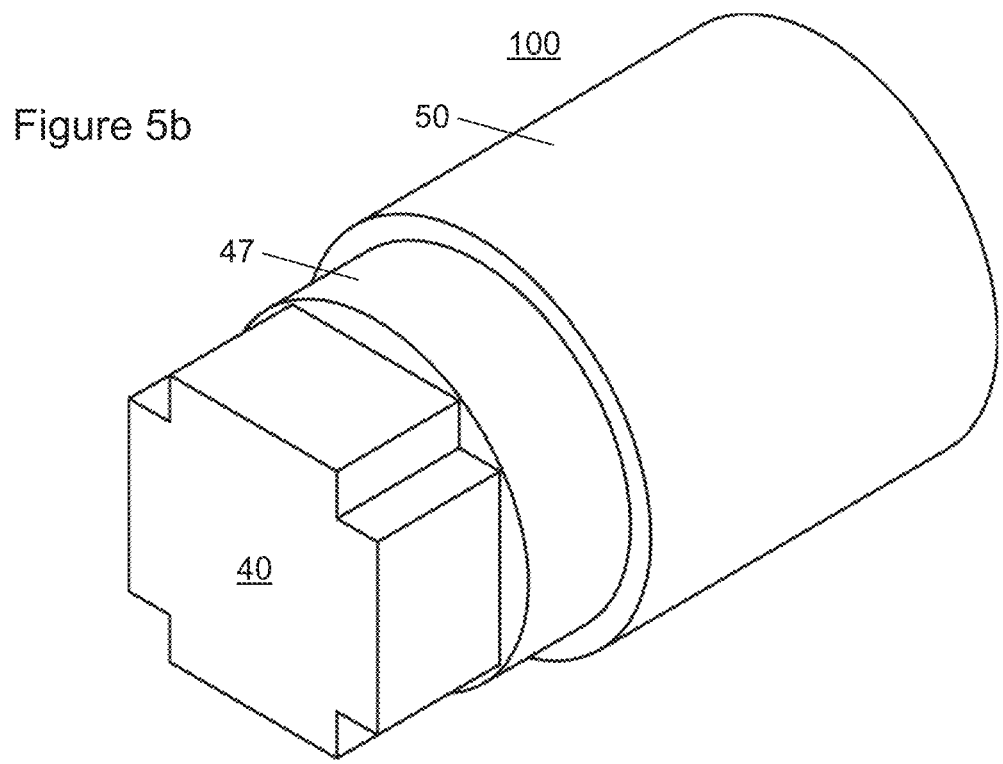
Figure 6A:
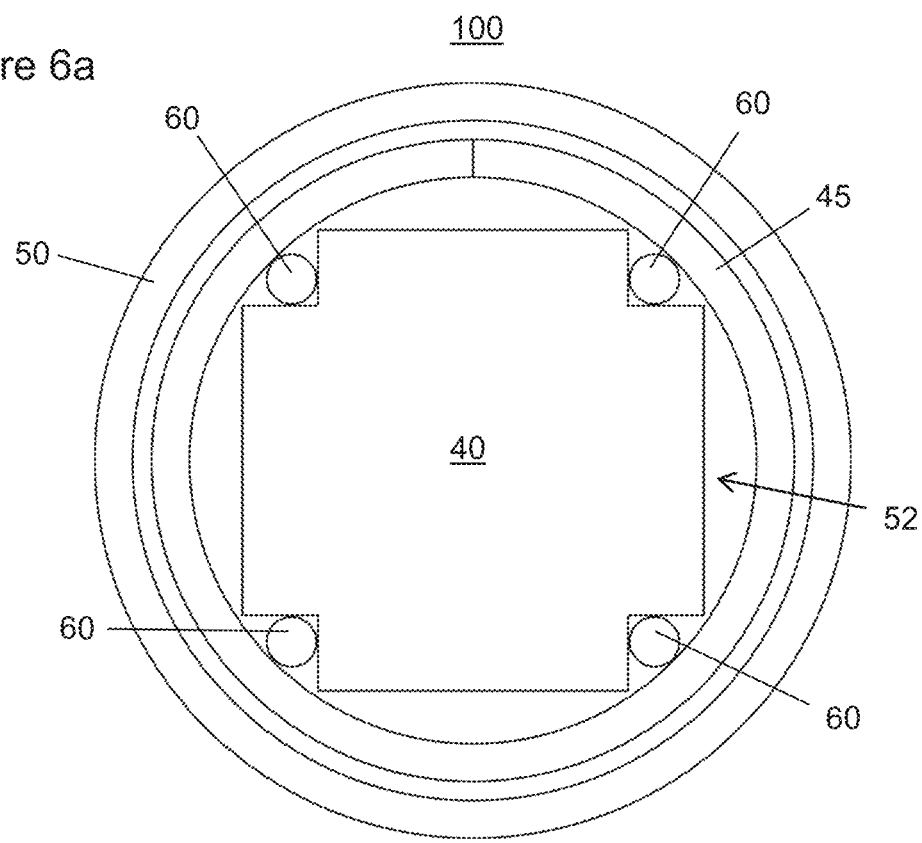
FIG. 6a shows a schematic image of the cross-section of another exemplary superconductive conductor producible with a preferred embodiment of the method or device, respectively, according to the invention, before a compacting.
Figure 6B:
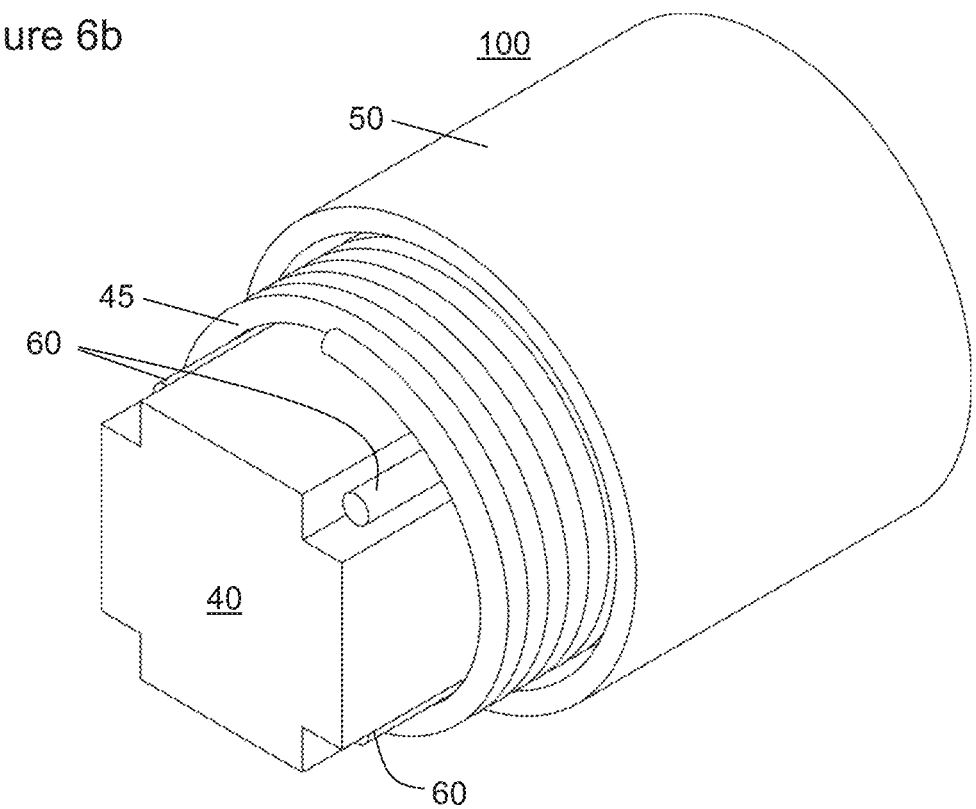
Figure 7A:
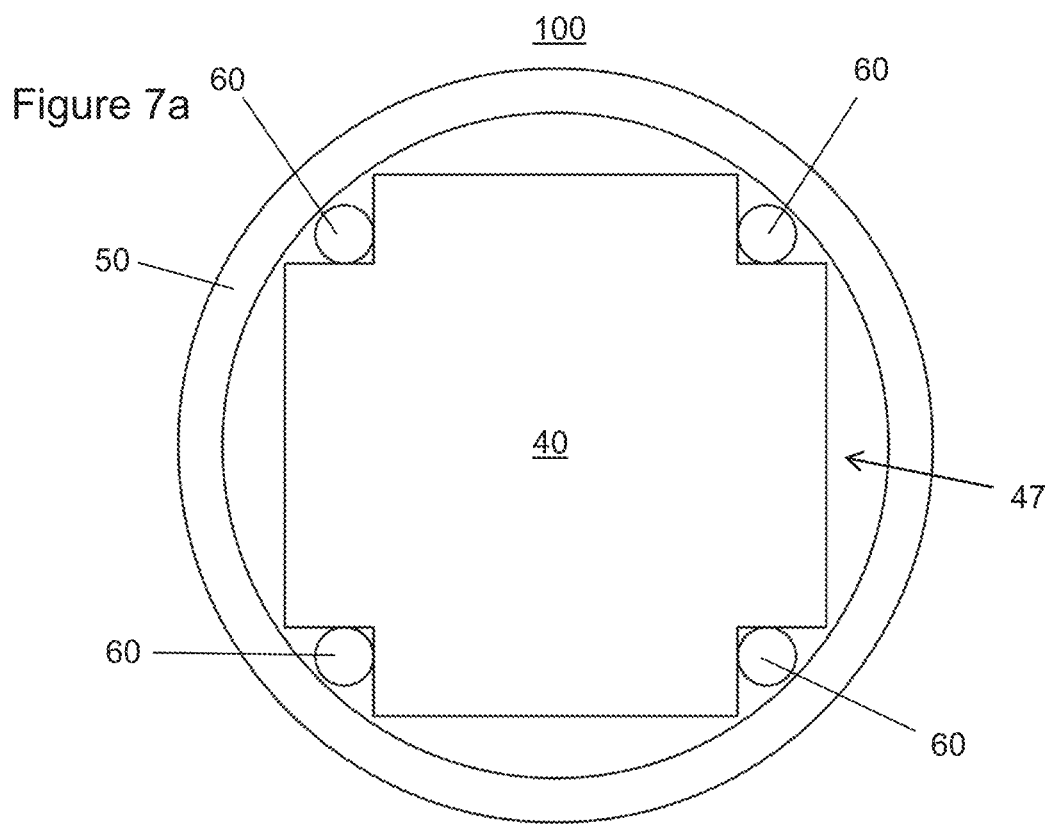
FIG. 7a shows a schematic image of the cross-section of another exemplary superconductive conductor producible with a preferred embodiment of the method or device, respectively, according to the invention, after a compacting.
Figure 7B:
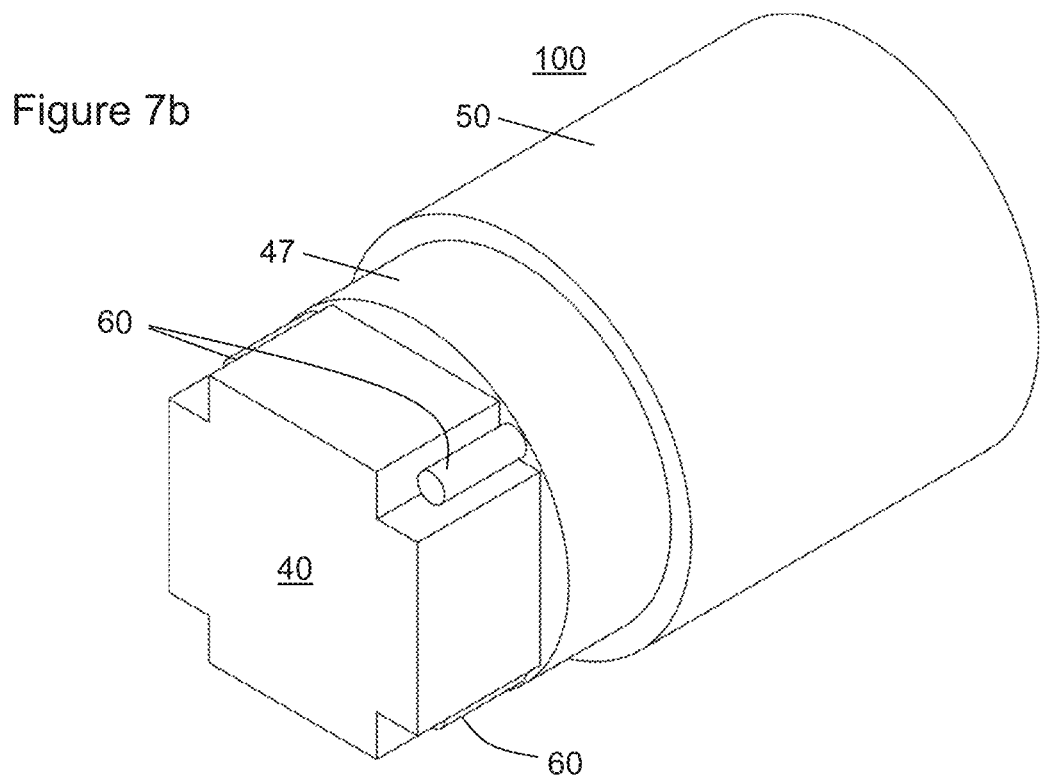

FIGS. 5a and 5b each show a schematic image of superconductive conductor 100 after it was heated above the melting temperature of the soldering strip 45 and compacted with suitable methods, such as a rotary swaging and/or swaging. As is discernible from FIG. 5a and the perspective view of FIG. 5b, the soldering wire 45 of FIG. 4a or 4b, respectively, turned into an extensive soldering layer 47 between superconductive body 40 and cladding tube 50 by means of heating and/or compacting.

FIGS. 6a, 6b, 7a and 7b each correspond to FIGS. 4a, 4b, 5a and 5b with the difference that the superconductive conductor 100 comprises additional fittings 60 in the example of FIGS. 6a, 6b, 7a and 7b, which were arranged together with the superconductive body 40 in the cladding tube 50 or inserted into cladding tube 50, respectively. In this way, the stability can be increased and soldering agent be saved.

As an alternative or addition to the soldering wire 45 the superconductive body 40 can be wrapped with other or further, respectively, wires or strips, e.g. with metal wires made of copper, aluminum and/or brass, or with steel wires. Such additional wires can ensure or increase, respectively, the stability and/or conductivity, in particular in a quench case.

Figure 8D:
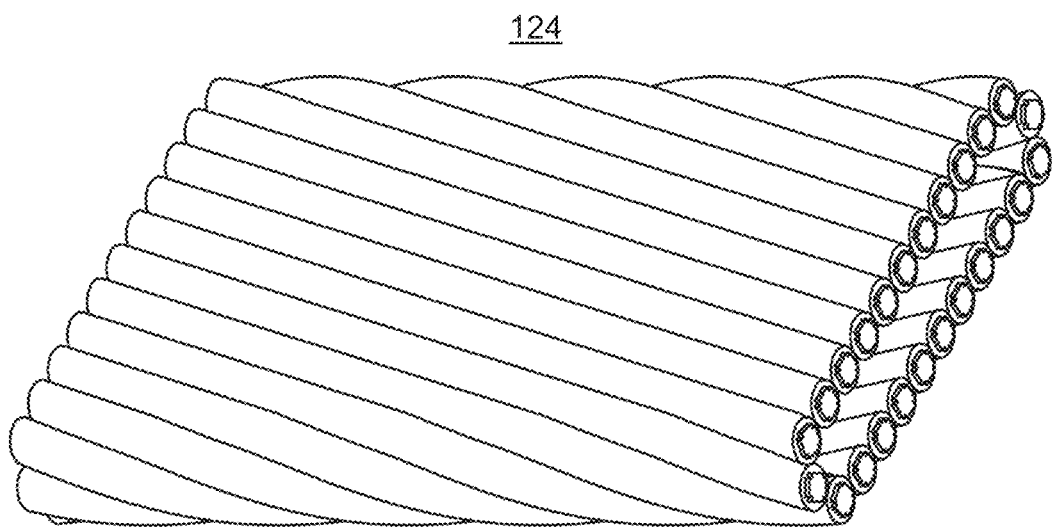
FIGS. 8a-8d show schematic images of different arrangements of one or more exemplary superconductive conductors producible with a preferred embodiment of the method or device, respectively, according to the invention, for forming a combination or cable, respectively.
Figure 8C:
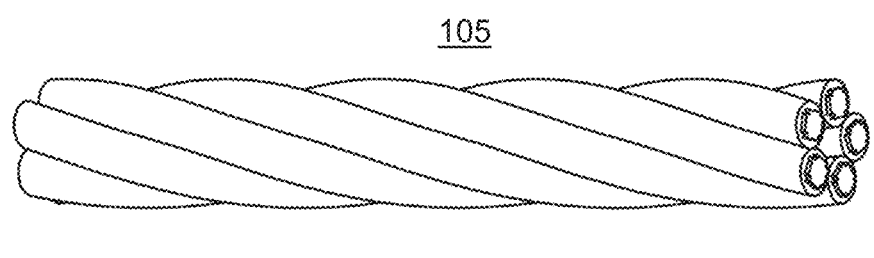
Figure 8B:
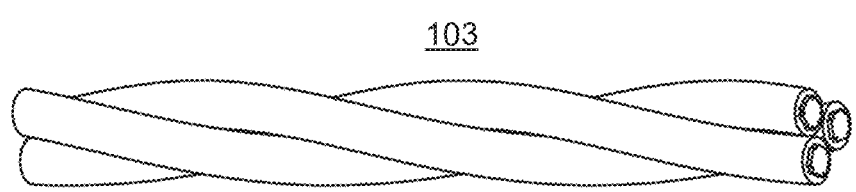
Figure 8A:
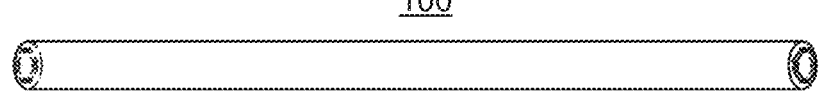

FIGS. 8a to 8d show schematic images of different arrangements of one or more exemplary superconductive conductor 100 producible with a preferred embodiment of the method or device, respectively, according to the invention, which have been formed into a combination or cable, respectively. The exemplary cross conductor 100 can, as shown in FIG. 8a, be used individually, or, as shown in FIGS. 8b to 8d, as cable, in particular in twisted combinations in order to increase ampacity according to the application. In FIG. 8b for instance a cable 103 with three superconductive conductors twisted with each other 100 is shown, in FIG. 8c a cable 105 with five superconductive conductors twisted with each other 100 is shown and in FIG. 8d a cable 124 with 24 superconductive conductors twisted with each other 100 is shown.

Figure 9A:
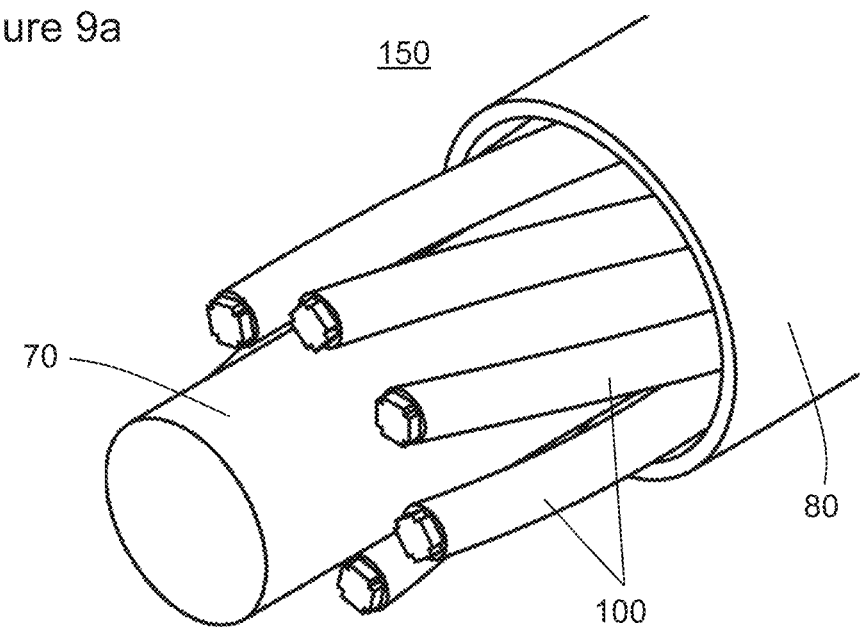
FIG. 9a shows a schematic image of an exemplary producible with a preferred embodiment of the method or device, respectively, according to the invention, in a perspective view.
Figure 9B:
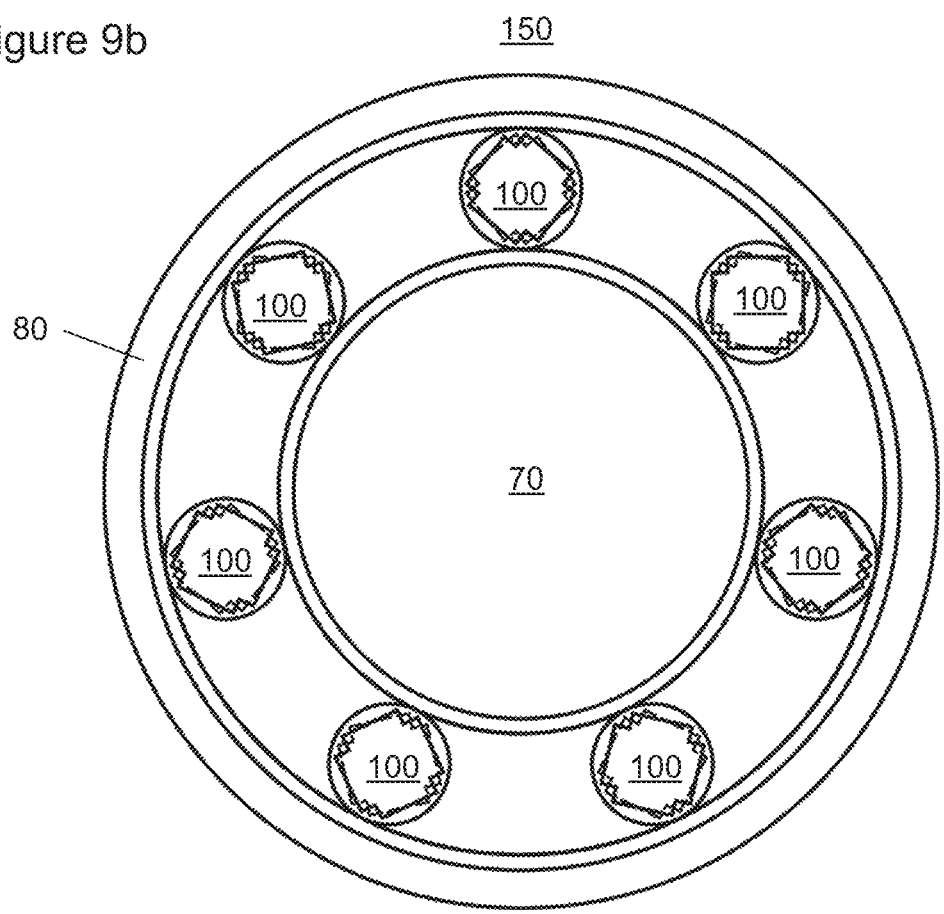
FIG. 9b shows a schematic image of an exemplary superconductive cable producible with a preferred embodiment of the method or device, respectively, according to the invention, in a cross-sectional view.

As shown in FIGS. 9a and 9b by means of a cable 150 a number of conductors 100 adapted to the current to be transferred can be arranged around a central tube 70 or in a suitable mounting so that the stray field of the individual conductors 100 is minimized. It is possible to pump cooling agent through the tube in order to cool the superconductors. In addition, as shown in FIGS. 9a and 9b, the cable 150 can be provided with a protective coat 80 which preferably is electrically insulating.

Figure 10A:
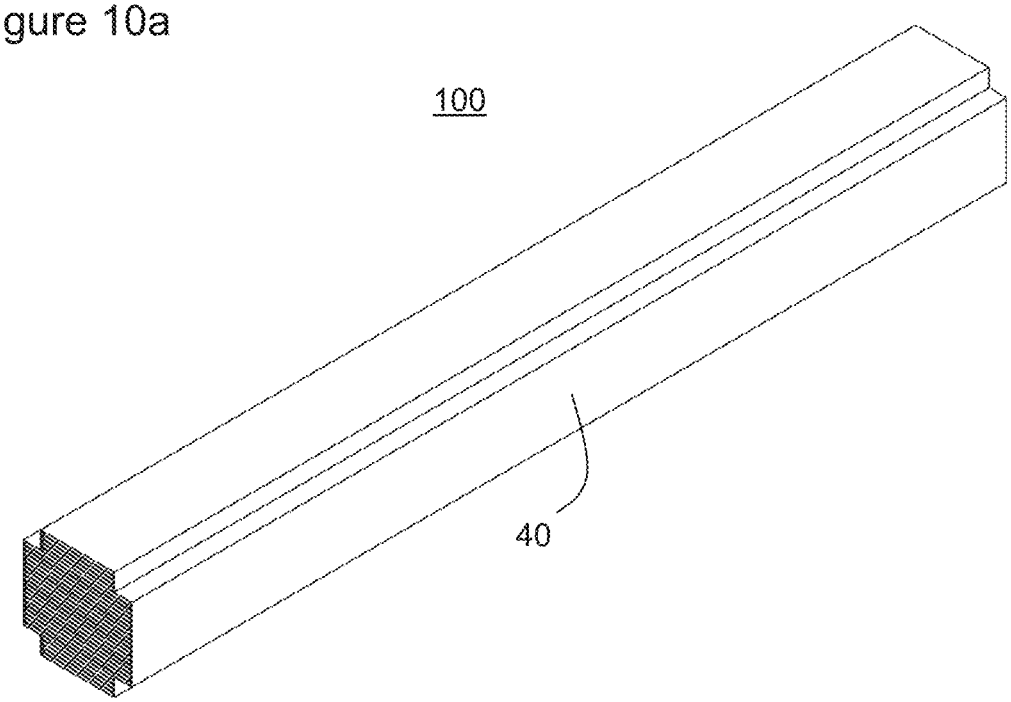
FIG. 10a shows a schematic drawing of an exemplary superconductive conductor producible with a preferred embodiment of the method or device, respectively, according to the invention, without twisting.
Figure 10B:
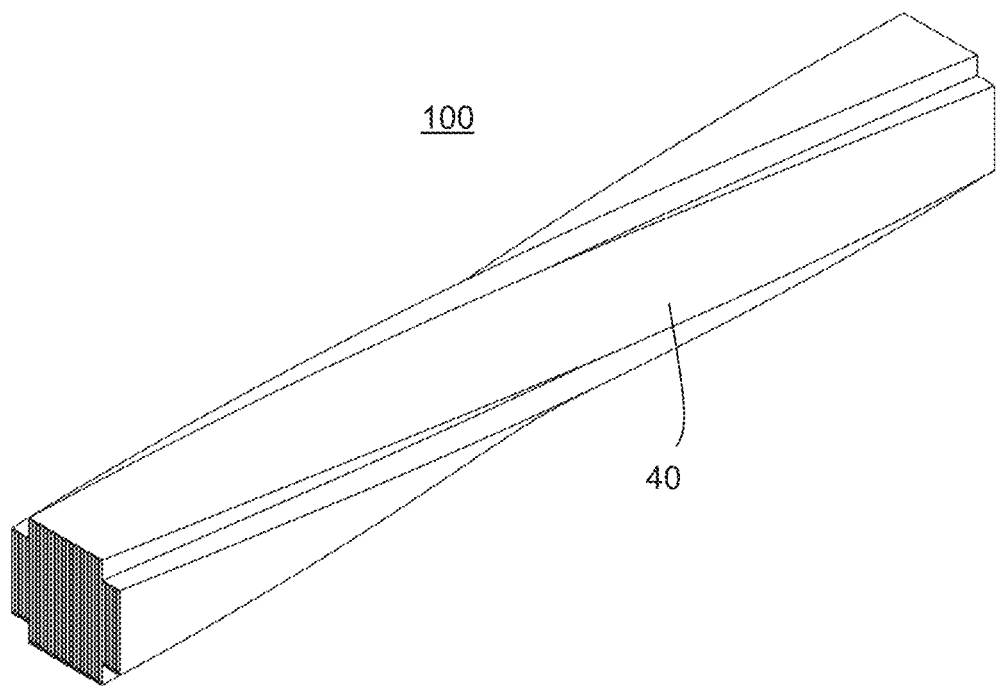
FIG. 10b shows a schematic drawing of an exemplary superconductive conductor producible with a preferred embodiment of the method or device, respectively, according to the invention, with twisting.

FIG. 10a shows a schematic drawing of an exemplary superconductive conductor 100 producible with a preferred embodiment of the method or device, respectively, according to the invention, without twisting, whereas in FIG. 10b a schematic drawing of an exemplary superconductive conductor 100 producible with a preferred embodiment of the method or device, respectively, according to the invention, with twisting is shown.

Figure 11:
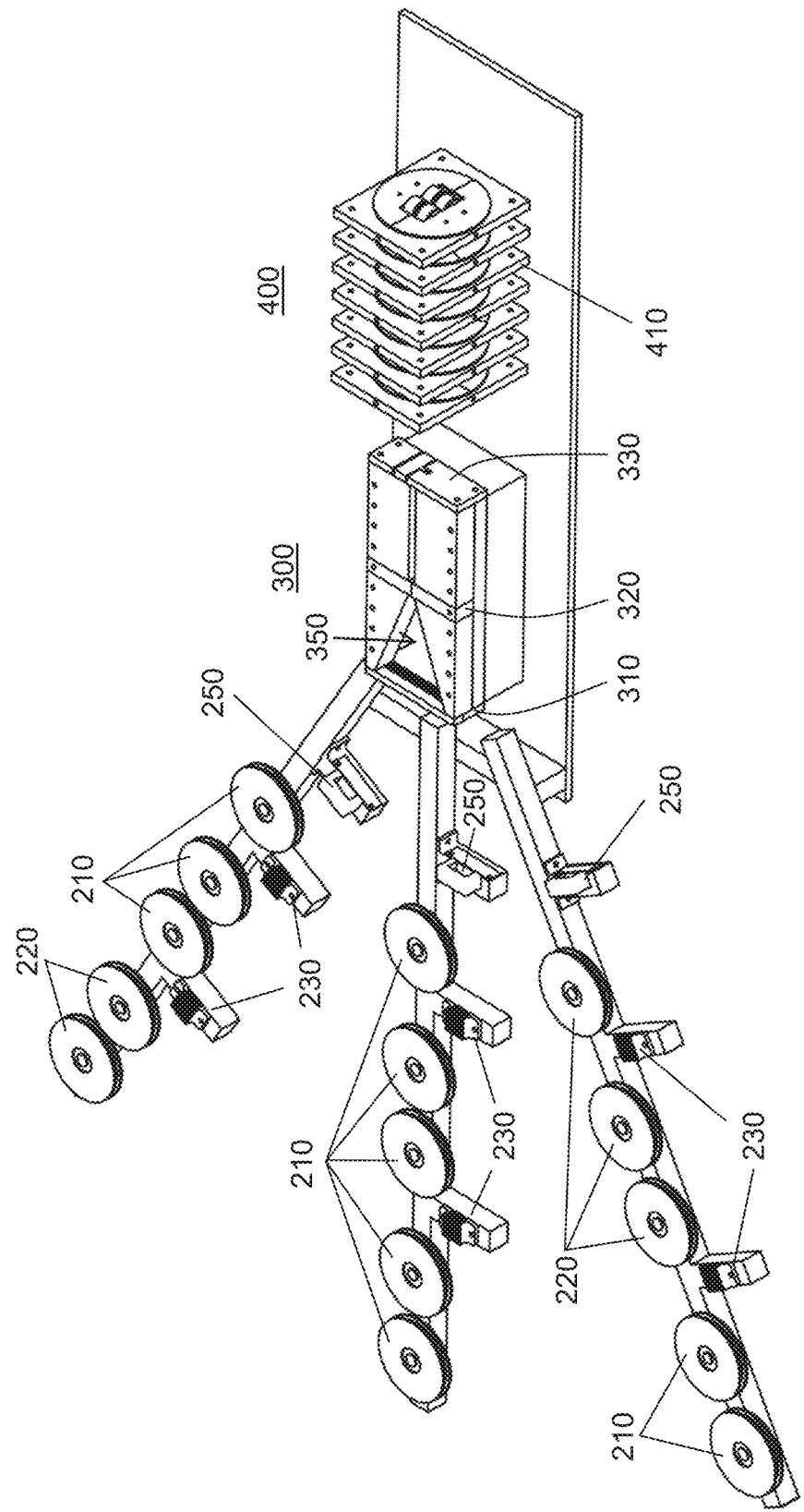
FIG. 11 shows a schematic drawing of a device for producing the superconductive conductor according to the invention according to one preferred embodiment.

FIG. 11 shows a schematic drawing of a device 500 for producing the superconductive conductor 100 according to the invention according to one preferred embodiment of the present invention.

Device 500 comprises a strip provision device 200, a soldering preparation device 250, a stack forming device 300 comprising a soldering device 350, and a roll system 400.

The strip provision device 200 comprises a plurality of first coils 210 for providing first superconductive strips and a plurality of second coils 220 for providing second superconductive strips. The superconductive strips, not represented in FIG. 11 for the sake of convenience, are each wound onto the coils 210 or 220, respectively, and are fed to the soldering preparation device 250 or the stack forming device 300, respectively, by means of guiding or orienting devices 230. In particular, the superconductive strips can be unwound of the coils 210 or 220, respectively, by means of a winch (not shown in FIG. 11) and a suitable rope, e.g. a steel rope and drawn through the device 500.

Contaminations and/or oxidation are removed from the superconductive strips by means of sponges of the soldering preparation device 250 soaked with cleaning and flux melting agent and the superconductive strips are prepared for the soldering process. Subsequently they are introduced into a soldering device or an electrically heatable soldering bath 350, respectively.

Figure 12:
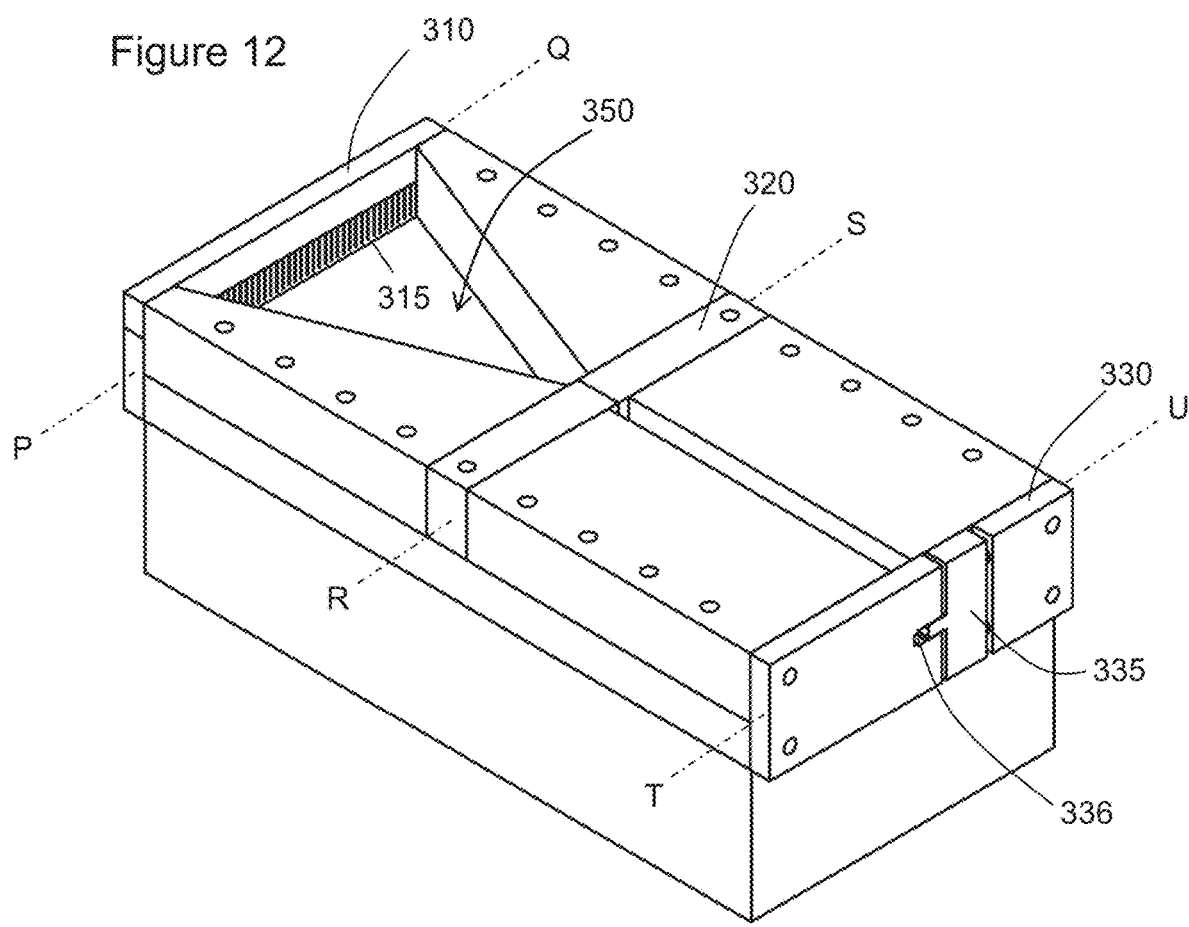
FIG. 12 shows a schematic drawing of a stack forming device according to a preferred embodiment of the device according to the invention in a perspective view.

A schematic drawing of the stack forming device 300, in one preferred embodiment as soldering bath 350, is again shown in detail in FIG. 12. The stack forming device 300 or the soldering bath 350, respectively, comprises an input 310, a passage 320 and an output 330. The soldering bath 350 is made of aluminum since most soldering materials do not wet aluminum without special preliminary treatment. Due to the large wetting angles associated therewith the soldering material cannot flow through a thin gap (with a width of about 0.3 mm). This allows for the implementation of inputs 315 of the soldering bath 350 as simple slits in an aluminum cuboidal block.

In the bottom of the soldering bath 350 one or more heating cartridges (not shown in the figures) are located, with a power suitable for heating the soldering material present in the soldering bath above the melting temperature of the soldering material. Moreover, in a rear side wall of the soldering bath 350 one or more thermocouples (not shown in the figures) are located, by means of which the temperature of the soldering material is brought to the desired temperature by means of a temperature controller (not shown in the figures). The temperature of the soldering bath is selected in such a way that on the one hand the superconductor is not damaged, and on the other the temperature of the soldering bath must be significantly higher than the melting temperature of the soldering agent so that the temperature of the soldering material through the cold superconductive strips passing through does not fall below the melting temperature. In case of $Pb_{37}Sn_{63}$ soldering material, having a melting temperature of 183° C., this is guaranteed for T~230° C. Other soldering materials require other working temperatures.

For every superconductive strip a separate input 315 into the stack forming device 300 or soldering bath 350, respectively, is provided, so that every strip can be wetted with soldering material on its entire surface when immersing it into the soldering material.

In the middle of the stack forming device 300 or soldering bath 350, respectively, a passage 320 adapted to the geometry is located, on which individual strips still completely being in liquid soldering material are combined into the cruciform shape and are stacked. The dimensions of the passage 320 are slightly larger than the dimensions of the strip stack built or to be built, respectively, so that in this place no pressure is applied yet onto the strips and these are merely combined into the desired cruciform cross-section.

The output 330 of the stack forming device 300 or soldering bath 350, respectively, comprises a spring-loaded sliding door 335, wherein a negative of the strip stack shape, e.g. a cross, is milled into the end plate of output 330 as output opening 336. On the one hand, thus a sufficient tightness of the bath is achieved, on the other hand the amount of soldering material between the strips is reduced and the shape predetermined.

Figure 13:
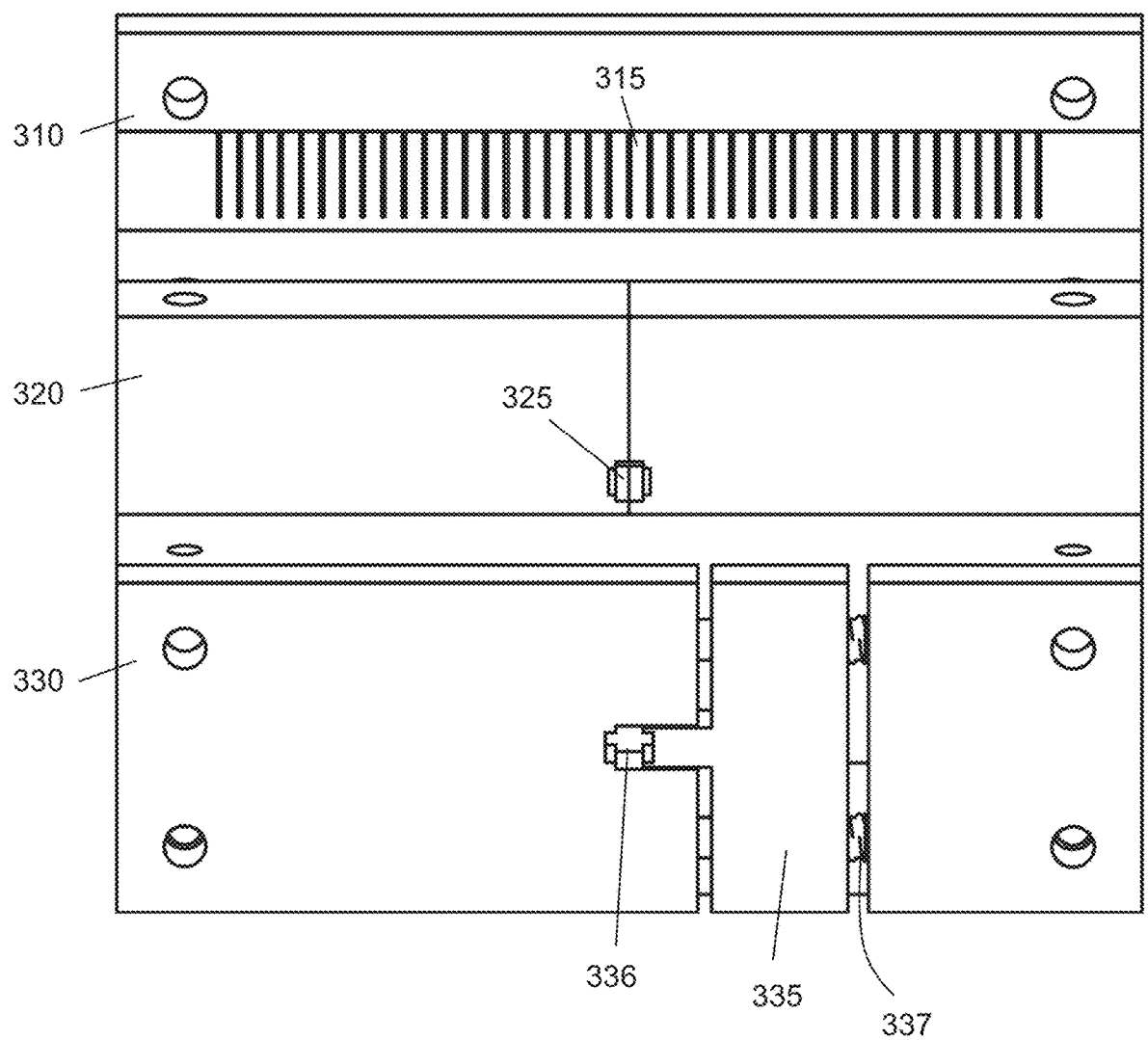
FIG. 13 shows schematic sectional views of selected parts of the stack forming device along the lines P-Q, R-S, and T-U of FIG. 12.

In FIG. 13 again schematic sectional views of selected parts, i.e. input 310, passage 320 and output 330, of the stack forming device 300 or soldering bath 350, respectively, along the lines P-Q, R-S, and T-U of FIG. 12 are shown. In particular the individual comb-like inputs 315 of input 310 for the superconductive strips, a space or opening 325, respectively, for creating the strip stack in the passage 320 as well as an output opening 336 and a sliding door 335 loaded with springs 337 in output 330 are shown.

In a short distance from the output 330 of the stack forming device 300 or soldering bath 350, respectively, the roll system 400, i.e. a pressure and torsion system, is arranged, comprising a plurality of roll units 410. It is possible by means of the roll system 400 to implement in a form-fit way a twisting of the cruciform strip stack with the soldering material still being liquid.

Figure 14:
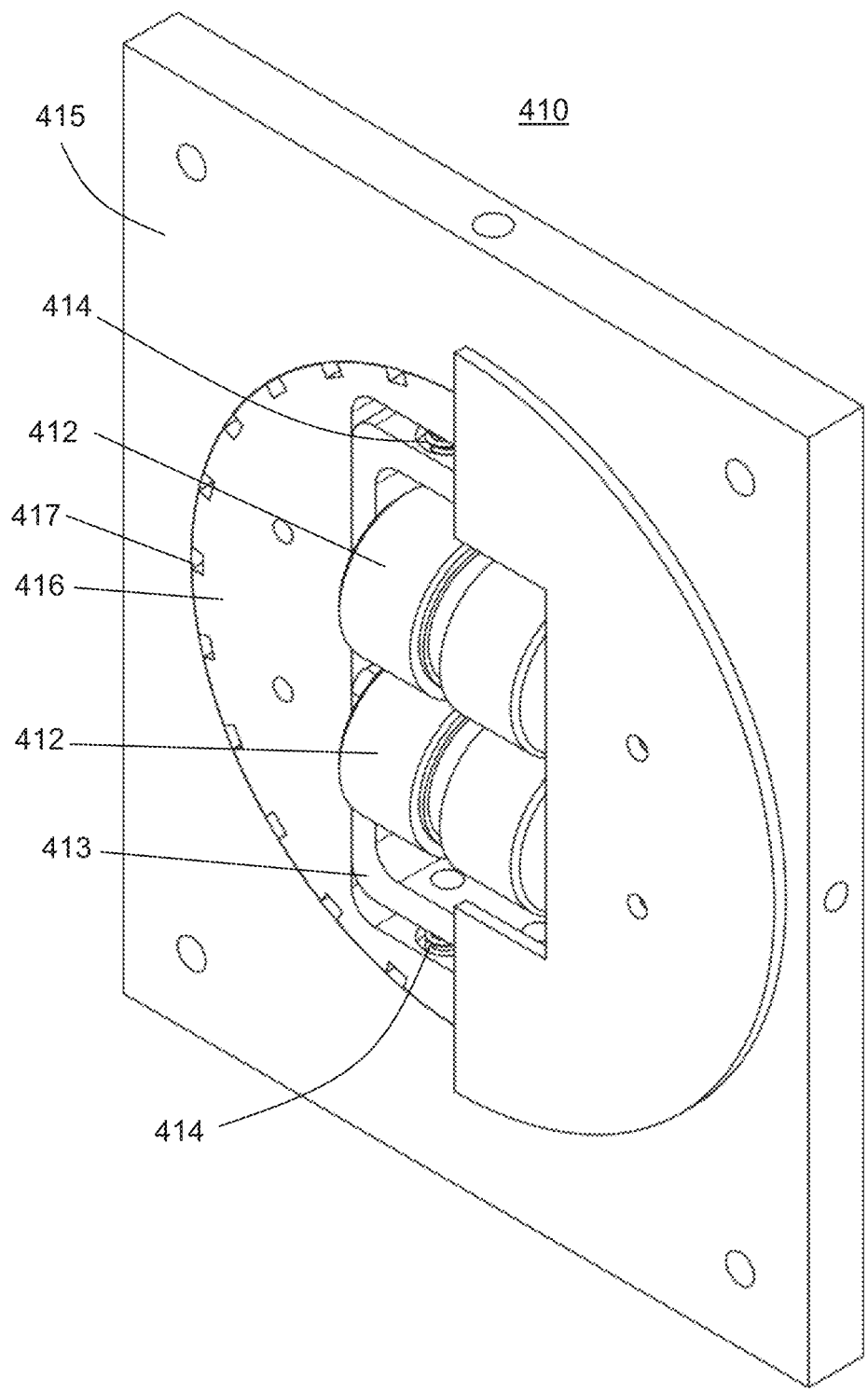
FIG. 14 shows a schematic image of a roll unit according to a preferred embodiment of the device according to the invention.

FIG. 14 shows a schematic detailed image of a press or roll unit 410, respectively, according to one preferred embodiment. The roll unit 410 comprises a frame 415 in which a circular mounting 416 can be engaged and fixed in discrete steps. In this way, the roll unit 410 or shape rolls 412 of the roll unit 410, respectively, can be twisted around a longitudinal axis of device 500. Thus, a twisting of the strip stack moved through the rolls in the direction of the longitudinal axis can be achieved. Two shape rolls 412 held in clamps 413 are connected with a receptacle of the roll unit 410 via springs 414. End plates keep the rolls 412 in position perpendicular to the longitudinal or cable axis, respectively. In this, the springs 414 ensure a constant contact pressure of the shape rolls 412 onto the strip stack, wherein the spring constant is selected in such a way that the compression does not result in a damaging of the strips but at the same time guarantees the form-fit of the shape rolls 412 with the strip stack, and in particular prevents the strip stack from "sliding through".

The diameter of the rolls 412 can for instance be 30 mm. For instance, 24 engaging grooves 417 for the controlled twisting and engaging of the shape rolls 412 are milled into the circular mounting 416. It goes without saying that the diameter and the number of engaging steps can be varied. By varying the distance of the rolls or roll units 410, respectively, to each other and by selecting suitable rotation angles (or relative rotation angles, respectively) of adjacent rolls, the twist pitch of the twisting of the superconductive conductor can be set in a targeted manner.

A superconductive conductor produced by means of the method or the device, respectively, according to the invention apart from high current densities also has a good current distribution as well as low current coupling lengths by means of the uniform and reliable soldering of the superconductive strips or strip stack, respectively, in the soldering bath. Load tests or tensile tests, respectively, carried out at a temperature of 4.2 K and a magnetic field of 12 T have shown that the cross conductor according to the invention only starts degrading at loads comparable to the ones of the individual superconductive strips.

The method or the device, respectively, according to the invention for producing the superconductive conductor in particular stands out by a high flexibility, for instance the change of the twist pitch being possible by a simple change of the distance of the rolls due to the modular design of the system. A change of the cross-section of the strip stack (e.g. by using other widths of the HTS strips or other geometries) can be implemented by changing the shape rolls and the slide output of the soldering bath in a short period of time. A fast and economic production of a strip stack in lengths relevant for the applications is also possible. The superconductive body can be produced with pull-through speeds of ca. 5 cm/s, which in comparison to traditional methods is a significant improvement with regard to speed or economy of time, respectively. Moreover, with the method or device, respectively, according to the invention a simple and economic production is provided by avoiding complex parts which can only be produced individually and with high effort and costs. All that is required for the superconductive strips producible with the method or device, respectively, according to the invention are strips or superconductive strips, flux melting agent, soldering agent and, if applicable, metal films or strips, tubes made of copper or other metal available on the market in standard sizes.

LIST OF REFERENCE SIGNS 1 conductive strip or superconductive strip, respectively
2 conductive strip or superconductive strip, respectively
10 middle portion
20 end portion
30 strip stack of conductive strips or superconductive strips, respectively
40 superconductive body
45 soldering wire/soldering strip
47 soldering layer
50 cladding tube
52 vacuities
60 fitting
70 tube
80 protective coat
100 superconductive conductor
103 bundle of superconductive conductors/cable
105 bundle of superconductive conductors/cable
124 bundle of superconductive conductors/cable
150 bundle of superconductive conductors/cable
200 strip or superconductive strip provision device
210 first coils
220 second coils
230 guiding or orienting devices, respectively
250 soldering preparation device/sponge
300 stack forming device
310 input
315 individual input
320 passage
325 space/opening for stack formation
330 output
335 sliding door
336 output opening
337 spring
350 soldering device/soldering bath
400 roll system
410 roll unit
412 shape roll
413 clamp
414 spring
415 frame
21
416 mounting
417 groove/engaging groove
420 steel rope
500 device/system

The invention claimed is:

1. A method for producing a superconductive conductor, the method comprising:
providing a plurality of conductive strips, wherein the plurality of conductive strips comprises at least one superconductive strip;
applying liquid soldering agent onto the plurality of conductive strips by immersing the conductive strips into a soldering bath;
forming a strip stack by stacking the conductive strips wetted with soldering agent in the soldering bath; and
forming a superconductive body by machining the strip stack with a roll system,
wherein the soldering bath has an input with a plurality of individual comb-like arranged inputs for the plurality of conductive strips, a passage for stacking the plurality of conductive strips, and an output.

2. The method according to claim 1, wherein
providing a plurality of conductive strips comprises providing a plurality of first conductive strips, each having a first width, and a plurality of second conductive strips, each having a second width, wherein the first width differs from the second width, and wherein
stacking the conductive strips wetted with soldering agent comprises forming the first and second conductive strips into a strip stack with a cruciform cross-sectional shape.

3. The method according to claim 2, wherein, before applying liquid soldering agent, the method comprises:
cleaning of the plurality of conductive strips and/or
applying flux melting agent onto the plurality of conductive strips with a soldering preparation device.

4. The method according to claim 2, wherein the soldering agent is in a liquid state when the superconductive body is formed by machining the strip stack.

5. The method according to claim 2 wherein machining the strip stack comprises twisting of the strip stack.

6. The method according to claim 2, further comprising the step of:
inserting the superconductive body into a cladding tube.

7. The method according to claim 6, wherein before inserting the superconductive body into the cladding tube the superconductive body is wrapped with one or more of solder, a metal wire, a steel strip, and an insulating material.

8. The method according to claim 6, wherein before inserting the superconductive body into the cladding tube the superconductive body is wrapped with solder and subsequently the superconductive body and/or the cladding tube is heated at least to the melting temperature of the solder to mechanically and/or electrically connect the superconductive body with the cladding tube.

9. The method according to claim 6, further comprising the step of:
compacting the cladding tube filled with the superconductive body.

10. The method according to claim 1, wherein, before applying liquid soldering agent, the method comprises:
cleaning of the plurality of conductive strips and/or applying flux melting agent onto the plurality of conductive strips with a soldering preparation device.

11. The method according to claim 1, wherein the soldering agent is in a liquid state when the superconductive body is formed by machining the strip stack.

12. The method according to claim 1 wherein machining the strip stack comprises twisting of the strip stack.

13. The method according to claim 1, further comprising the step of:
   inserting the superconductive body into a cladding tube.

14. The method according to claim 13, wherein before inserting the superconductive body into the cladding tube the superconductive body is wrapped with one or more of solder, a metal wire, a steel strip, and an insulating material.

15. The method according to claim 13, wherein before inserting the superconductive body into the cladding tube the superconductive body is wrapped with solder and subsequently the superconductive body and/or the cladding tube is heated at least to the melting temperature of the solder to mechanically and/or electrically connect the superconductive body with the cladding tube.

16. The method according to claim 13, further comprising the step of:
   compacting the cladding tube filled with the superconductive body.

17. A method for producing a superconductive conductor, the method comprising:
   providing a plurality of conductive strips, wherein the plurality of conductive strips comprises at least one superconductive strip;
   applying liquid soldering agent onto the plurality of conductive strips by immersing the conductive strips into a soldering bath;
   forming a strip stack by stacking the conductive strips wetted with soldering agent in the soldering bath; and
   forming a superconductive body by machining the strip stack with a roll system,
   wherein providing a plurality of conductive strips comprises providing a plurality of first conductive strips, each having a first width, and a plurality of second conductive strips, each having a second width, wherein the first width differs from the second width, and
   wherein stacking the conductive strips wetted with soldering agent comprises forming the first and second conductive strips into a strip stack with a cruciform cross-sectional shape.

* * * * *